(12) United States Patent
Moehlmann (10) Patent No.: US 10,778,233 B1
(45) Date of Patent: Sep. 15, 2020

(54) PHASE LOCKED LOOP WITH PHASE AND FREQUENCY LOCK DETECTION

(71) Applicant: NXP B.V., Eindhoven (NL)

(72) Inventor: Ulrich Moehlmann, Moisburg (DE)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 16/540,829

(22) Filed: Aug. 14, 2019

(51) Int. Cl.
  *H03L 7/095*  (2006.01)
  *H03L 7/093*  (2006.01)

(52) U.S. Cl.
  CPC .............. *H03L 7/095* (2013.01); *H03L 7/093* (2013.01)

(58) Field of Classification Search
  USPC .................................. 327/147–149, 156–158
  See application file for complete search history.

(56) References Cited

U.S. PATENT DOCUMENTS

| 5,905,410 | A | 5/1999 | Holmes et al. | |
|---|---|---|---|---|
| 7,342,985 | B1* | 3/2008 | Stene | H03L 7/0812 327/149 |
| 2004/0017263 | A1* | 1/2004 | Livezey | H03L 7/0802 331/158 |
| 2004/0130364 | A1* | 7/2004 | Suzuki | H03L 7/095 327/157 |
| 2004/0150480 | A1 | 8/2004 | Lee | |
| 2005/0238129 | A1* | 10/2005 | Ishida | H03L 7/095 375/376 |
| 2008/0197897 | A1 | 8/2008 | Iwaida et al. | |
| 2010/0183109 | A1 | 7/2010 | Lin et al. | |
| 2011/0273210 | A1* | 11/2011 | Nagaraj | H03L 7/0802 327/159 |
| 2011/0285438 | A1* | 11/2011 | Kinugasa | H03L 7/087 327/157 |
| 2014/0085016 | A1* | 3/2014 | Lee | H03L 7/095 331/1 A |
| 2015/0033060 | A1* | 1/2015 | Kim | G06F 1/12 713/400 |
| 2016/0344396 | A1 | 11/2016 | Moehlmann | |
| 2017/0366192 | A1 | 12/2017 | Möehlmann | |

OTHER PUBLICATIONS

Bae et al., "A Digital Lock Detector for a Dual Loop PLL," IEEE ISOCC2014, pp. 194-195; 2 pages.
Melikyan et al., "Digital Lock Detector for PLL," IEEE, 2008; 2 pages.

* cited by examiner

*Primary Examiner* — Adam D Houston
(74) *Attorney, Agent, or Firm* — Rajeev Madnawat (57) ABSTRACT

A method for Phase Locked Loop (PLL) lock detection includes determining a phase error by comparing a feedback phase to a reference phase. A frequency error is determined by comparing a feedback frequency to a reference frequency. A lock signal is determined in response to the phase error being less than an upper phase threshold and greater than a lower phase threshold, and the frequency error being less than an upper frequency threshold and greater than a lower frequency threshold.

18 Claims, 8 Drawing Sheets

PHASE LOCKED LOOP WITH PHASE AND FREQUENCY LOCK DETECTION

FIELD

This disclosure relates generally to a Phase Locked Loop (PLL), and more specifically to improving the lock detection of a PLL using phase and frequency information.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

A PLL is considered to be in a locked state when the generated phase and frequency output of the PLL are settled within predefined limits. During the locking interval, the phase offset and frequency offset are typically never zero at the same time. Previous methods for lock detection rely on inserted delays following the zero crossing event, which undesirably extends the time required for lock detection. Furthermore, relying on the zero crossing event reduces the reliability of lock detection because the required settling time following the zero crossing varies with loop dynamics and the operating environment.

In one example of a PLL relying only on phase offset to determine the locked state, a lock is reported when the phase offset is below a predefined threshold for a fixed duration. In one example, the fixed duration is equal to at least one ringing interval (e.g., time between two of the zero crossing events). This approach to lock detection is problematic because if the PLL system is optimized for phase noise performance, PLL damping is small and thus the PLL output may overshoot or ring for longer than the fixed duration.

Conversely, in an example of a PLL relying only on frequency offset to determine the locked state, an erroneous result (and thus a false lock) is possible due to parasitic effects. More specifically, certain stable phase error patterns will modulate the PLL oscillator, resulting in the desired frequency on average, but with a phase that is not within the predefined limits. Embodiments described herein, rely on a combination of both phase and frequency information to determine a locked state of the PLL in a reliable and expeditious manner.

Figure 1:
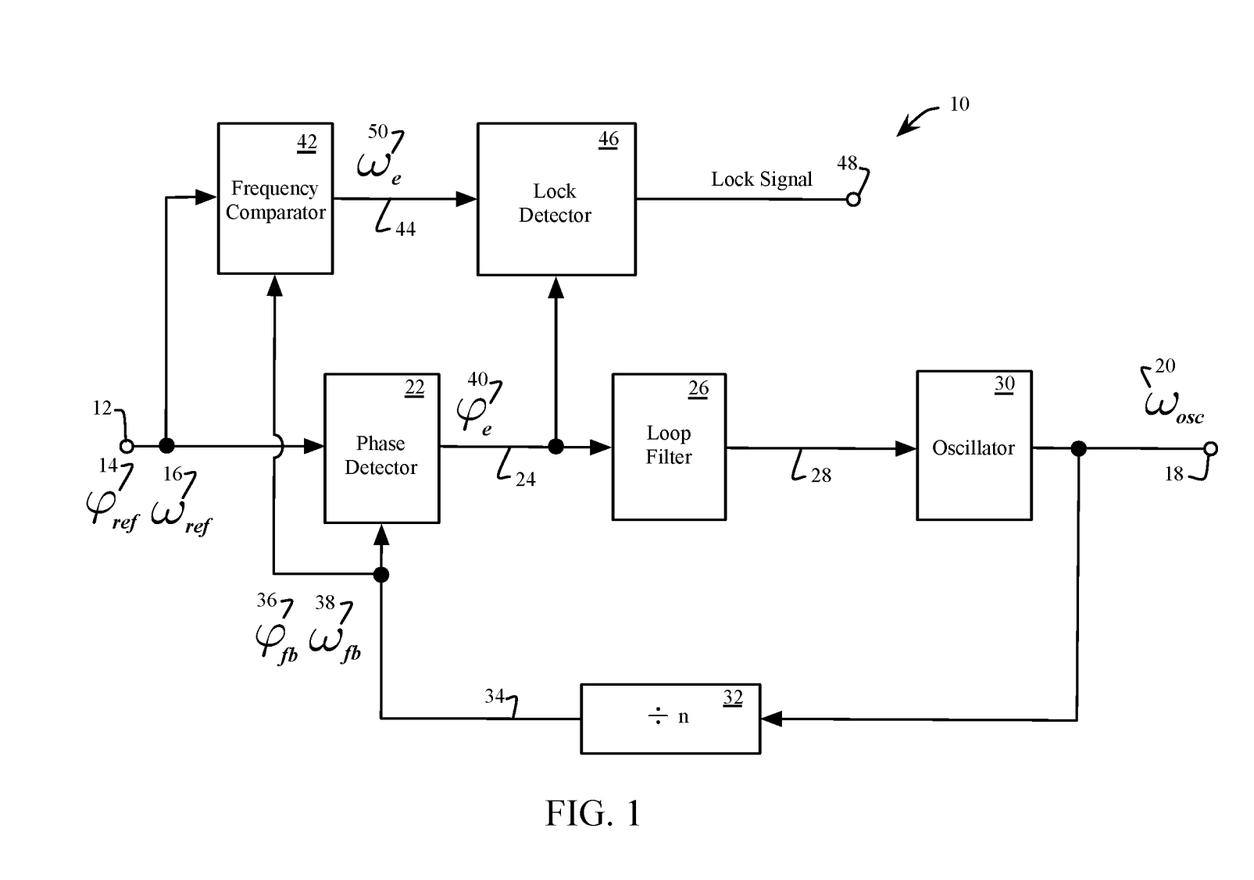
FIG. 1 is a schematic view of a PLL system with phase and frequency lock detection, in accordance with an example embodiment of the present disclosure.

FIG. 1 shows an embodiment 10 of a PLL system combining both phase and frequency information for a more reliable and fast lock detection, in accordance with the present disclosure. The embodiment 10 receives at the PLL input 12 a reference phase 14 and a reference frequency 16. The embodiment 10 generates, at a PLL output 18, a waveform having an oscillator frequency 20. The embodiment 10 includes a phase detector (or phase comparator) 22 connected between the PLL input 12 and a phase detector output 24. A loop filter (e.g., a low pass filter) 26 is connected between the phase detector output 24 and a filtered output 28. An oscillator (e.g., a voltage controlled oscillator) 30 is connected between the filtered output 28 and the PLL output 18.

A divider 32 receives the waveform at the PLL output 18 and outputs at a divider output 34, a feedback phase 36 and a feedback frequency 38 connected to inputs of the phase detector 22 and a frequency comparator 42, respectively. A lock detector 46 is connected between a frequency comparator output 44 and a lock signal 48, generated by the lock detector 46. The phase detector 22 determines a phase error 40 by comparing the feedback phase 36 to the reference phase 14. The frequency comparator determines a frequency error 50 by comparing the feedback frequency 38 to the reference frequency 16. The lock detector 46 generates the lock signal 48 by comparing both the phase error 40 and the frequency error 50 against respective upper and lower threshold limits, to ensure that the waveform at the PLL output 18 has a stabilized phase and frequency close to the targeted lock values. It should be appreciated that in various embodiments, the functional blocks of the embodiment 10 are implemented in digital, analog or a combination of digital and analog circuitry.

Figure 2:
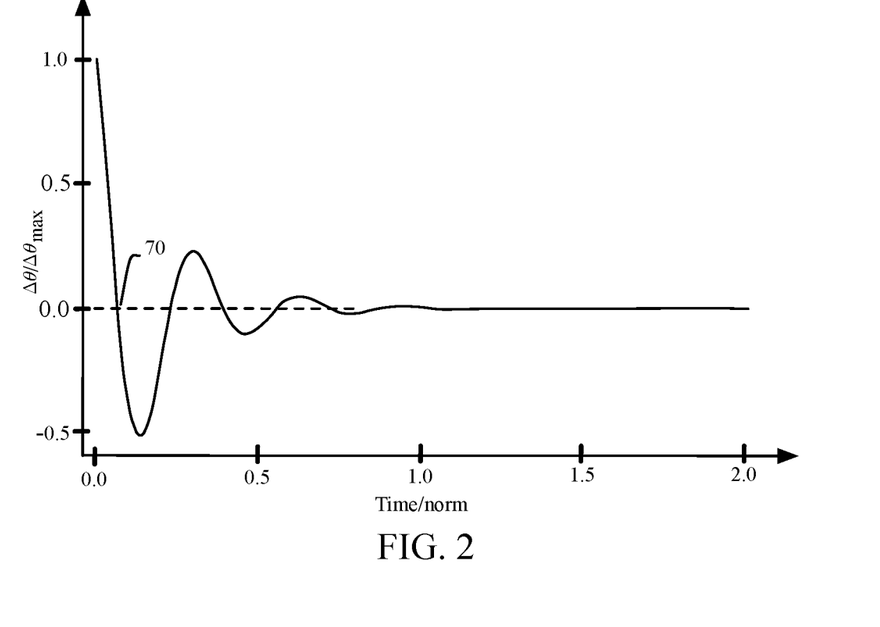
FIG. 2 is a graphical view of an example embodiment of a normalized PLL phase error during lock detection.
Figure 3:
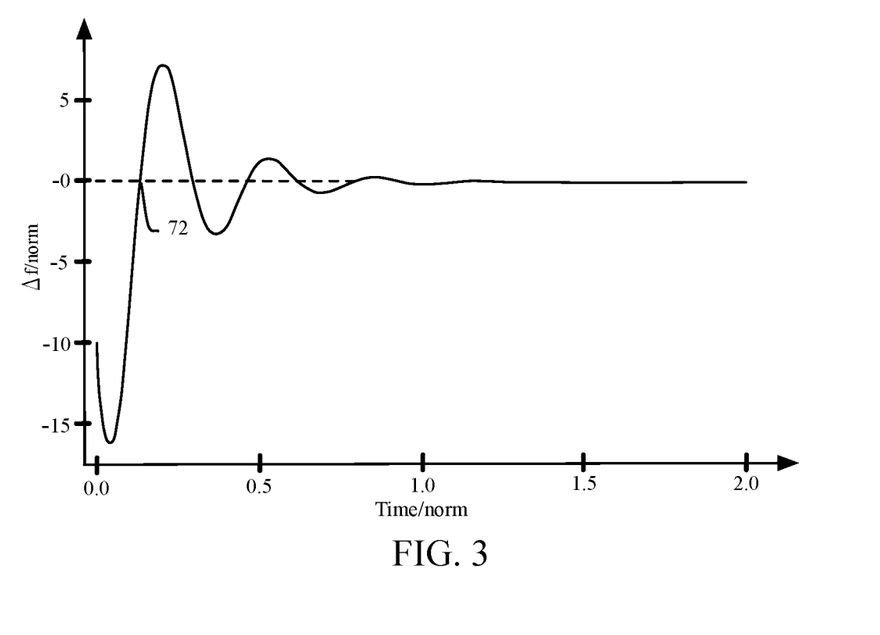
FIG. 3 is a graphical view of an example embodiment of a normalized PLL frequency error during lock detection, synchronized to the time axis of FIG. 2.

FIG. 2 and FIG. 3 show the respective normalized phase and frequency of the waveform at the PLL output 18. Comparing FIG. 2 to FIG. 3, one can see that the respective first (and subsequent) zero crossing events 70 and 72 do not occur at the same time. However, both the phase and frequency settle close to their respective zero values over time, when the locked state is accomplished.

Figure 4:
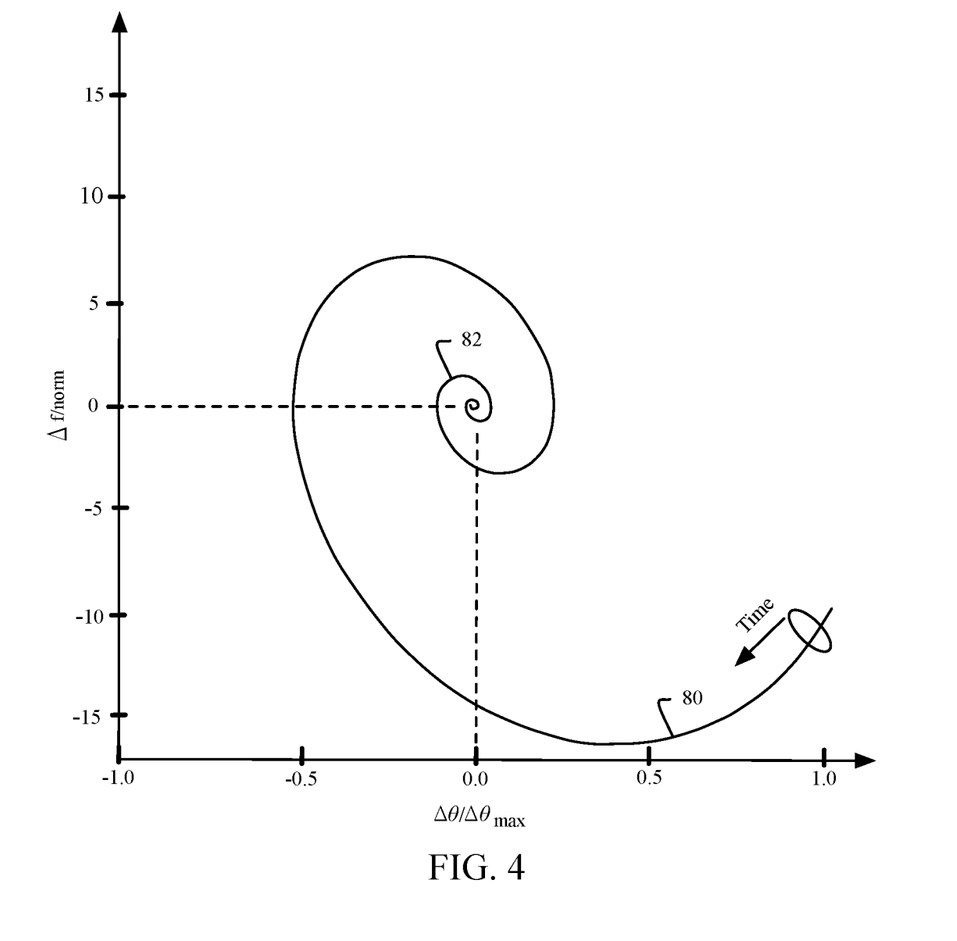
FIG. 4 is example embodiment of a phase-frequency trajectory plot showing a relationship of the normalized phase and frequency errors of FIG. 2 and FIG. 3.

FIG. 4 shows a phase-frequency trajectory plot, presenting the information of FIG. 2 and FIG. 3 with a combined view. The relationship between the normalized phase error 40 and normalized frequency error 50 of the waveform at the PLL output 18 proceeds from a time 80 to a time 82, and continues to converge to a waveform with both phase and frequency approaching zero. As can be seen from FIG. 4, the zero crossing events of the phase occur with a significant frequency offset. Conversely, the zero crossing events of the frequency occur with a significant phase offset. The relative values of the zero crossing events, and related phase or frequency offsets are dependent, in part, on the loop dynamics of the PLL shown in the example embodiment 10.

Figure 5:
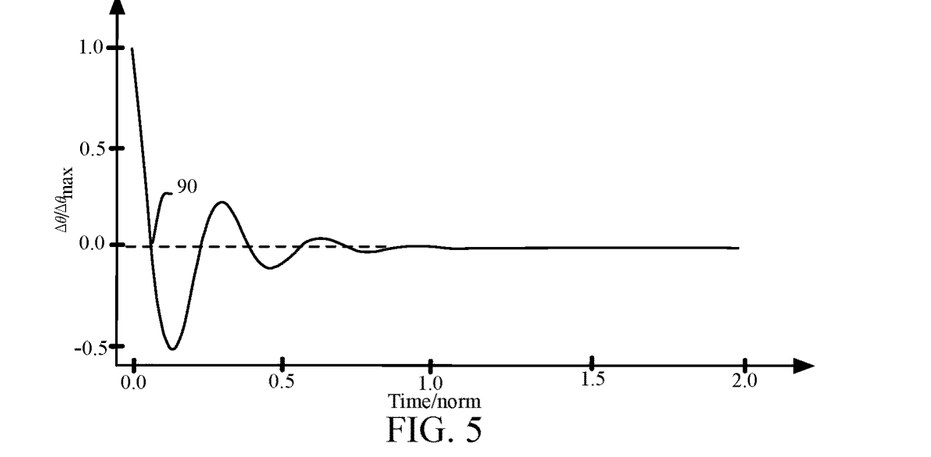
FIG. 5 and FIG. 6 are graphical views of the normalized phase and frequency errors of FIG. 1, in accordance with an example embodiment of the present disclosure.
Figure 6:
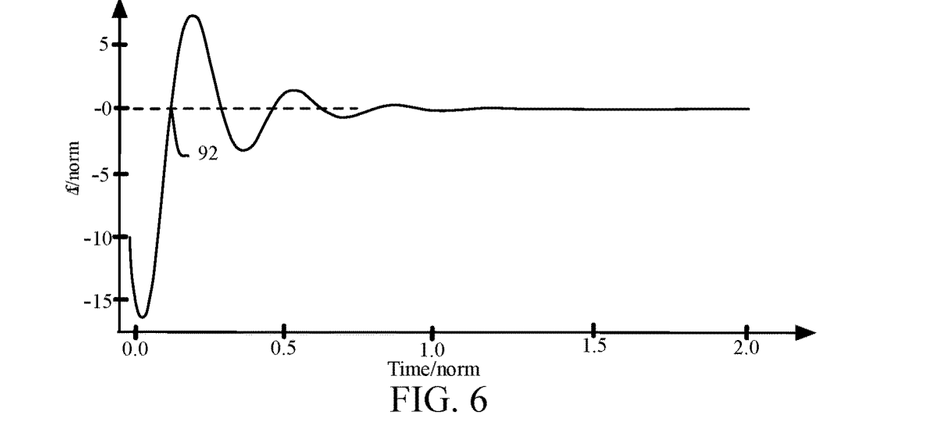
Figure 7:
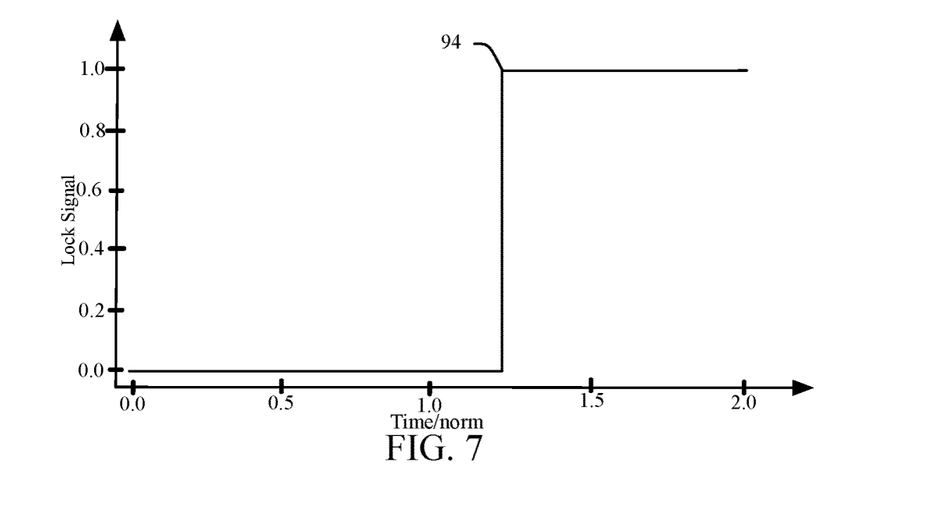
FIG. 7 is a graphical view of the lock signal of FIG. 1 in response to the normalized phase and frequency errors of FIG. 5 and FIG. 6 respectively, in accordance with an example embodiment of the present disclosure.

FIG. 5 to FIG. 7, with reference to FIG. 1 show the results of lock detection for a lock detector 46 using both the frequency error 50 and the phase error 40. Specifically, while the respective zero crossing events 90 and 92 of the normalized phase and frequency of the waveform at the PLL output 18 do not occur at the same time, relying on a combination of the phase error 40 and the frequency error 50 being within defined threshold limits results in a faster and more reliable lock detection, independent of fixed delays timed from the zero crossing events. As shown in FIG. 7, the lock signal 48 transitions to a locked state at time 94 once the frequency error 50 and the phase error 40 are both within the defined threshold limits.

Figure 8:
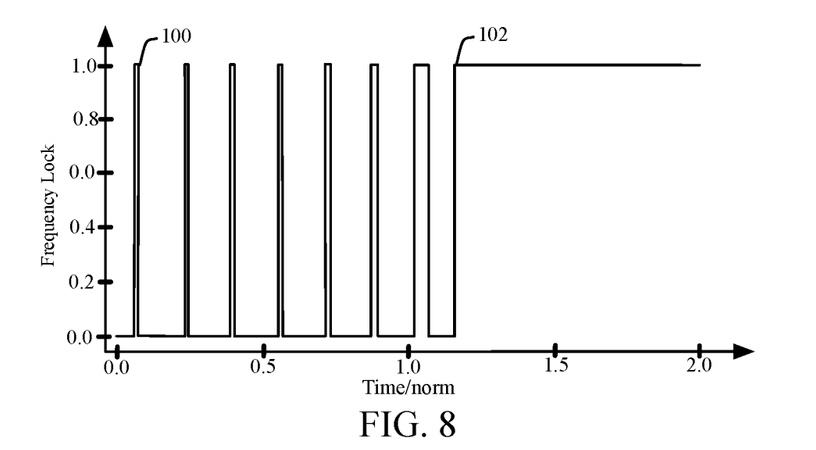
FIG. 8, FIG. 9 and FIG. 10 are graphical views of embodiments of a lock signal based on frequency detection, phase detection and combined phase and frequency detection respectively.
Figure 9:
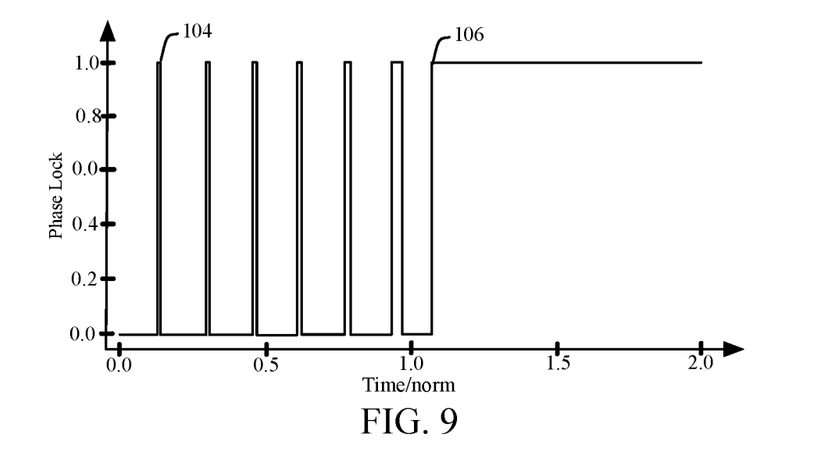
Figure 10:
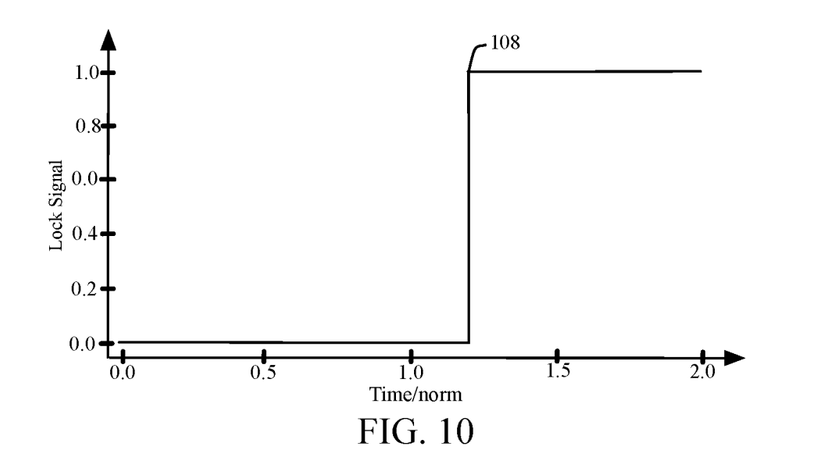

FIG. 8 to FIG. 10, with reference to FIG. 1 further highlight the issues with lock detection based solely on frequency error or phase error (with timed delays), as opposed to lock detection using both the frequency error and phase error. In FIG. 8, a lock signal based solely on frequency information will toggle in and out of the locked state, beginning at time 100 and finally settling into the locked state at time 102. In FIG. 9, a lock signal based solely on phase information will toggle in and out of the locked state, beginning at time 104 and finally settling into the locked state at time 106. In contrast, FIG. 10 shows a clean transition to the locked state at time 108 for an embodiment 10 using both the frequency error 50 and the phase error 40.

Figure 11:
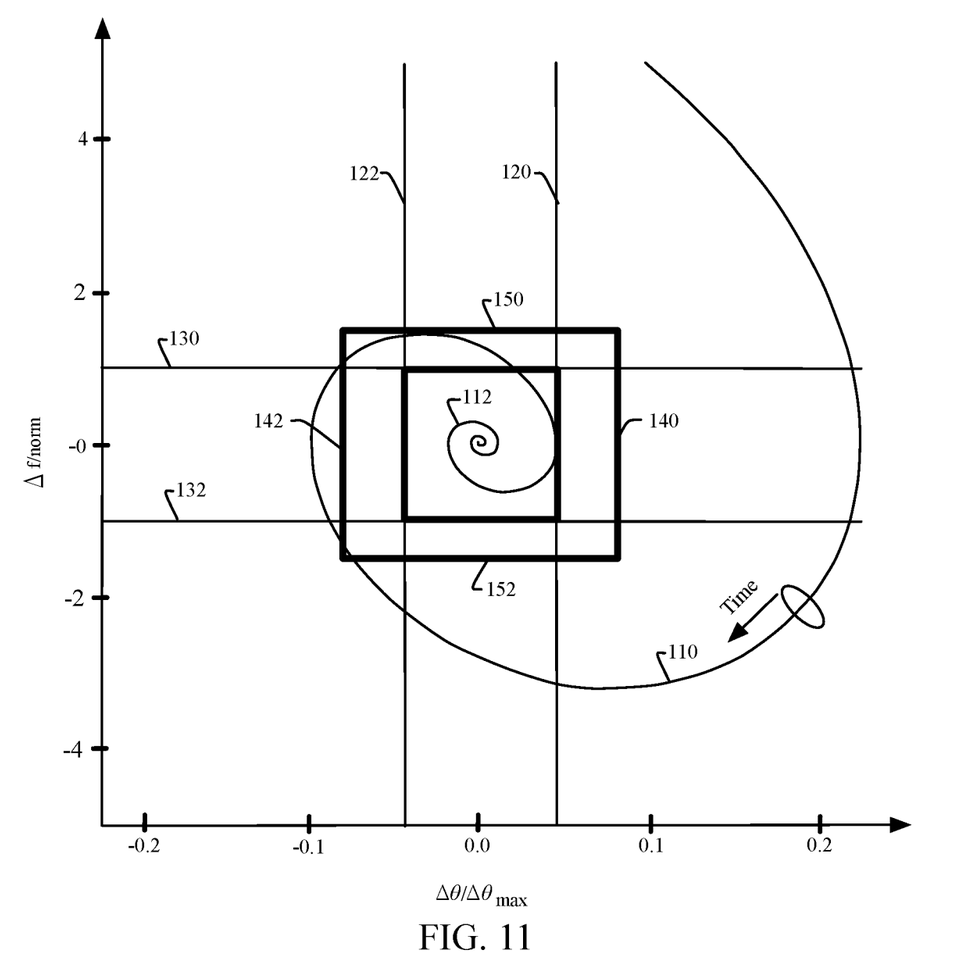
FIG. 11 is a phase-frequency trajectory plot with limits for phase and frequency locking, in accordance with an example embodiment of the present disclosure.

FIG. 11 shows a phase-frequency plot including limits for phase and frequency locking, in accordance with an example embodiment of the present disclosure. With continued reference to FIG. 1, the relationship between the normalized phase error 40 and normalized frequency error 50 of the waveform at the PLL output 18 proceeds from a time 110 to a time 112, and continues to converge to a waveform with both phase and frequency approaching zero. When the phase error 40 converges between the limits defined by a first upper phase threshold 120 and a first lower phase threshold 122, and the frequency error 50 converges between the limits defined by a first upper frequency threshold 130 and a first lower frequency threshold 132, as determined by the lock detector 46, the lock signal 48 will transition to a locked state.

In another embodiment of the lock detector 46, hysteresis is added to prevent ringing at the PLL output 18 while entering and exiting the locked state. Specifically, the lock signal 48 transitions to the unlocked state if the phase error 40 becomes greater than a second upper phase threshold 140 or less than a second lower phase threshold 142. Similarly, the lock signal 48 transitions to the unlocked state if the frequency error 50 becomes greater than a second upper frequency threshold 150 or less than a second lower frequency threshold 152. The lock signal 48 will also transition to the unlocked state if both the phase error 40 and the frequency error 50 exceed the limits defined by the thresholds 140, 142, 150 and 152.

In one example embodiment, the separation of the thresholds 120, 122, 130 and 132 defining entry into the locked state and the thresholds 140, 142, 150 and 152 defining exit from the locked state is determined by one or more of a fabrication process, voltage or temperature spread of the PLL, by varying startup conditions of the PLL, which may change the shape or rotation of the phase-frequency trajectory shown in FIG. 11, and by noise contributions. In other example embodiment, the first thresholds 120, 122, 130 and 132 are half of their respective counterpart second thresholds 140, 142, 150 and 152. In another embodiment a first region defined by the first thresholds 120, 122, 130 and 132 is not centered within a second region defined by their respective counterpart second thresholds 140, 142, 150 and 152.

In one example embodiment, the phase threshold limits 120 and 122 are first set based on a design specification. Subsequently, the frequency threshold limits 130 and 132 are set to ensure that the lock signal 48 exits the locked state, when the phase error 40 is zero, while ensuring that the frequency threshold limits 130 and 132 exceed the frequency offset variation when the lock signal 48 is in the locked state.

In another example embodiment, the frequency threshold limits 130 and 132 are first set based on a design specification. Subsequently, the phase threshold limits 120 and 122 are set to ensure that the lock signal 48 exits the locked state, when the frequency error 50 is zero, while ensuring that the phase threshold limits 120 and 122 exceed the phase offset variation when the lock signal 48 is in the locked state.

In another example embodiment, the lock signal 48 is filtered by a low pass filter at the output of the lock detector 46 to further reduce ringing when the lock signal 48 transitions between the locked and unlocked states. In one embodiment, the feedback frequency 38 is determined from an analog frequency of the divider output 34, accounting for the frequency division performed by the divider 32. In another embodiment, the feedback frequency 38 is determined from an analog frequency at the PLL output 18.

In another embodiment, the feedback frequency 38 is determined by counting pulses of a digital frequency of the divider output 34, accounting for the frequency division performed by a digital embodiment of the divider 32. In another embodiment, the feedback frequency 38 is determined by counting pulses of a digital frequency at the PLL output 18. In another embodiment, the feedback frequency 38 is determined by a value of an analog control input (e.g., the filtered output 28) of the oscillator 30. In another embodiment, the feedback frequency 38 is derived by differentiating the feedback phase 36 and subtracting the result from a reference value. Deriving the feedback frequency 38 by differentiating the feedback phase 36 is advantageous for a digital implementation of the embodiment 10, having digital signal processing, and allows the feedback frequency 38 to be continuously available.

Figure 12:
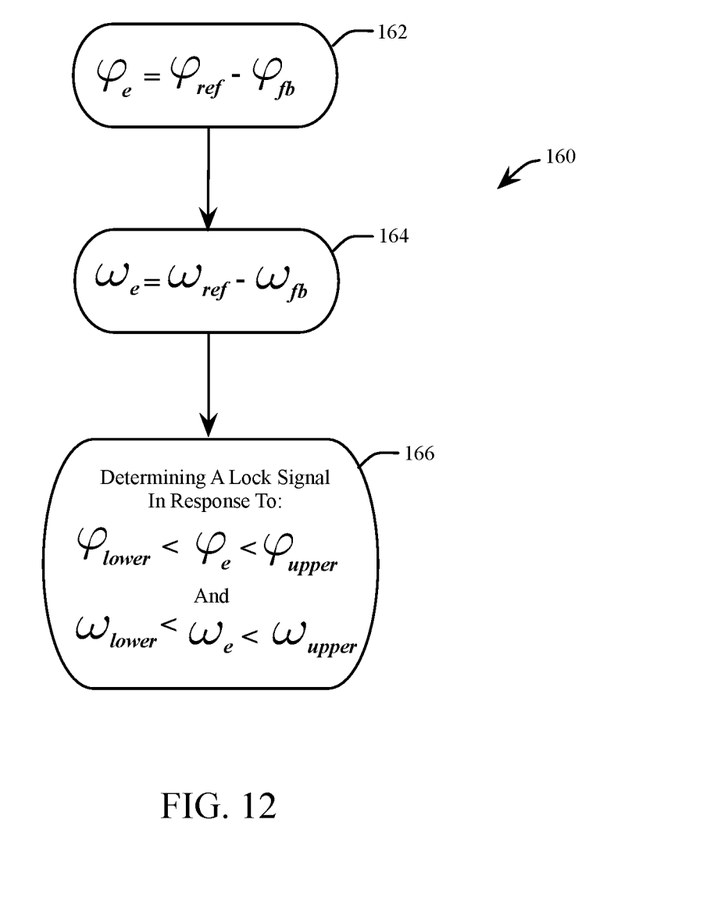
FIG. 12 is a flowchart representation of a method for PLL lock detection in accordance with an example embodiment of the present disclosure.

FIG. 12 shows an example embodiment 160 of a method for PLL lock detection. With reference to FIG. 1 and FIG. 11, the embodiment 160, at 162, determines a phase error 40 by comparing (e.g., subtracting) a feedback phase 36 from a reference phase 14. At 164, a frequency error 50 is determined by comparing (e.g., subtracting) a feedback frequency 38 from a reference frequency 16. At 166, a lock signal 48 is determined in response to the phase error 40 being less than an upper phase threshold 120 and greater than a lower phase threshold 122, and the frequency error 50 being less than an upper frequency threshold 130 and greater than a lower frequency threshold 132.

Figure 13:
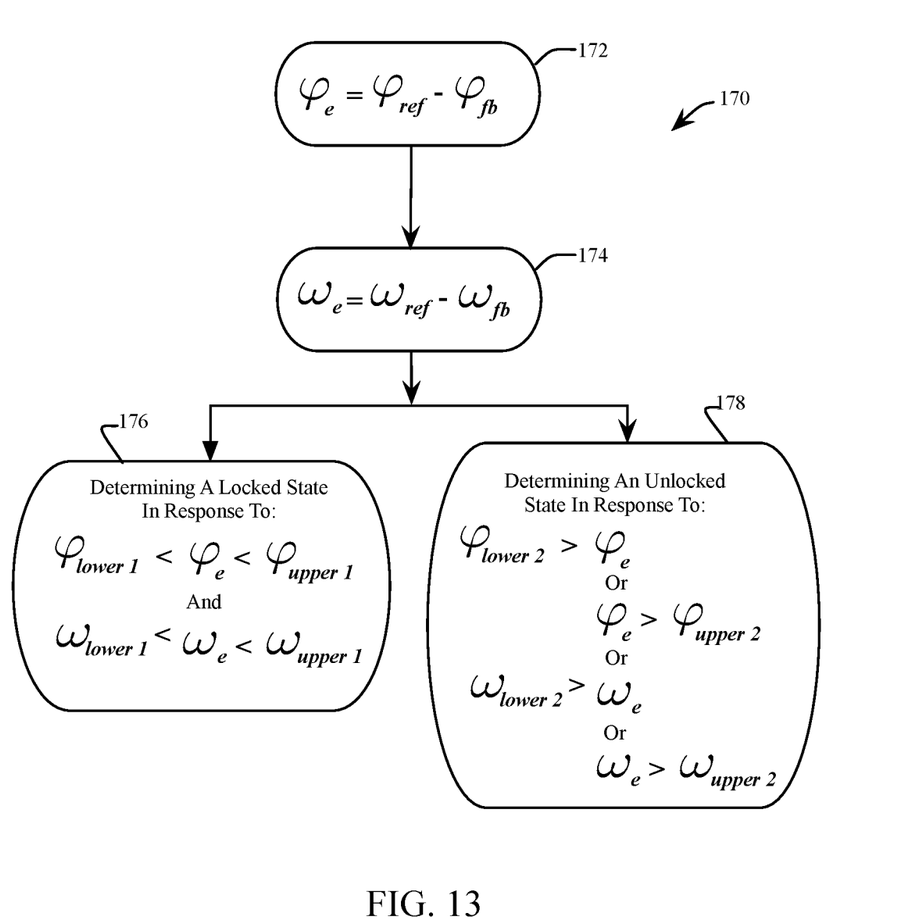
FIG. 13 is a flowchart representation of a method for PLL lock detection in accordance with an example embodiment of the present disclosure.

FIG. 13 shows an example embodiment 170 of a method for PLL lock detection. With reference to FIG. 1 and FIG. 11, the embodiment 170, at 172, a phase error 40 equals a difference between a feedback phase 36 and a reference phase 14. At 174, a frequency error 50 equals a difference between a feedback frequency 38 and a reference frequency 16. At 176, a locked state is determined in response to the phase error 40 being less than a first upper phase threshold 120 and greater than a first lower phase threshold 122, and the frequency error 50 being less than an first upper frequency threshold 130 and greater than a first lower frequency threshold 132. At 178, an unlocked state is determined in response to one of the phase error 40 being greater than a second upper phase threshold 140 or being less than a second lower phase threshold, the frequency error 50 being greater than a second upper frequency threshold 150 or being less than a second lower frequency threshold 152. For lock detection, the PLL uses the inner limits defined at 176. For unlock detection, the PLL uses the outer limits at 178, and transitions from the locked state to the unlocked state.

As will be appreciated, embodiments as disclosed include at least the following. In one embodiment, an apparatus comprises a phase comparator configured to generate a phase error equal to a phase difference between a reference phase and a feedback phase. A frequency comparator is configured to generate a frequency error equal to a frequency difference between a reference frequency and a feedback frequency. A lock detector is configured to generate a lock signal in response to the phase error being less than an upper phase threshold and greater than a lower phase threshold, and the frequency error being less than an upper frequency threshold and greater than a lower frequency threshold.

Alternative embodiments of the apparatus include one of the following features, or any combination thereof. The phase error is one of being greater than the upper phase threshold and being less than the lower phase threshold when the frequency error is zero. The frequency error is one of being greater than the upper frequency threshold and being less than the lower frequency threshold when the phase error is zero. The feedback frequency is derived from an analog control input of an oscillator, the analog control input derived from a filtered output of the phase comparator. The frequency comparator further comprises a counter configured to count a plurality of cycles of the feedback frequency. The feedback frequency is generated by a divider connected to an oscillator output of an oscillator, the oscillator coupled to a filtered output of the phase comparator. The feedback frequency is derived by a differentiator, configured to differentiate the feedback phase. The lock signal is set to an unlocked state in response to one of the phase error being greater than a second upper phase threshold, the phase error being lower than a second lower phase threshold, the frequency error being greater than a second upper frequency threshold and the frequency error being lower than a second lower frequency threshold. A low pass filter is between the lock detector and the lock signal. A loop filter is connected between the phase detector and an oscillator, and a divider connected between an oscillator output of the oscillator and the phase comparator.

In another embodiment, method for PLL lock detection comprises determining a phase error by comparing a feedback phase to a reference phase. A frequency error is determined by comparing a feedback frequency to a reference frequency. A lock signal is determined in response to the phase error being less than an upper phase threshold and greater than a lower phase threshold, and the frequency error being less than an upper frequency threshold and greater than a lower frequency threshold.

Alternative embodiments of the method for PLL lock detection include one of the following features, or any combination thereof. The phase error is one of being greater than the upper phase threshold and being less than the lower phase threshold when the frequency error is zero. The frequency error is one of being greater than the upper frequency threshold and being less than the lower frequency threshold when the phase error is zero. The feedback phase is differentiated to generate the feedback frequency. Determining the lock signal comprises setting the lock signal to an unlocked state in response to one of the phase error being greater than a second upper phase threshold, the phase error being lower than a second lower phase threshold, the frequency error being greater than a second upper frequency threshold and the frequency error being lower than a second lower frequency threshold. The lock signal is filtered with a low pass filter.

In another embodiment, a method for PLL lock detection comprises setting a lock signal to a locked state in response to a phase error being less than a first upper phase threshold and greater than a first lower phase threshold, and a frequency error being less than a first upper frequency threshold and greater than a first lower frequency threshold, wherein the phase error equals a phase difference between a feedback phase and a reference phase, and the frequency error equals a frequency difference between a feedback frequency and a reference frequency. The lock signal is set to an unlocked state in response to one of the phase error being greater than a second upper phase threshold, the phase error being less than a second lower phase threshold, the frequency error being greater than a second upper frequency threshold and the frequency error being less than a second lower frequency threshold.

Alternative embodiments of the method for PLL lock detection include one of the following features, or any combination thereof. The phase error is one of being greater than the upper phase threshold and being less than the lower phase threshold when the frequency error is zero. The frequency error is one of being greater than the upper frequency threshold and being less than the lower frequency threshold when the phase error is zero. The first upper phase threshold is less than the second upper phase threshold, the first lower phase threshold is greater than the second lower phase threshold, the first upper frequency threshold is less than the second upper frequency threshold, and the first lower frequency threshold is greater than the second lower frequency threshold.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements.

What is claimed is:
1. An apparatus comprising:
a phase comparator configured to generate a phase error equal to a phase difference between a reference phase and a feedback phase;
a frequency comparator configured to generate a frequency error equal to a frequency difference between a reference frequency and a feedback frequency; and
a lock detector configured to generate a lock signal in response to the phase error being less than an upper phase threshold and greater than a lower phase thresh- old, and the frequency error being less than an upper frequency threshold and greater than a lower frequency threshold.

2. The apparatus of claim 1 wherein the phase error is one of being greater than the upper phase threshold and being less than the lower phase threshold when the frequency error is zero.

3. The apparatus of claim 1 wherein the frequency error is one of being greater than the upper frequency threshold and being less than the lower frequency threshold when the phase error is zero.

4. The apparatus of claim 1 wherein the feedback frequency is derived from an analog control input of an oscillator, the analog control input derived from a filtered output of the phase comparator.

5. The apparatus of claim 1 wherein the frequency comparator further comprises a counter configured to count a plurality of cycles of the feedback frequency.

6. The apparatus of claim 1 wherein the feedback frequency is generated by a divider connected to an oscillator output of an oscillator, the oscillator coupled to a filtered output of the phase comparator.

7. The apparatus of claim 1 wherein the lock signal is set to an unlocked state in response to one of the phase error being greater than a second upper phase threshold, the phase error being lower than a second lower phase threshold, the frequency error being greater than a second upper frequency threshold and the frequency error being lower than a second lower frequency threshold.

8. The apparatus of claim 1 comprising a loop filter connected between the phase detector and an oscillator, and a divider connected between an oscillator output of the oscillator and the phase comparator.

9. A method for Phase Locked Loop (PLL) lock detection comprising:
 determining a phase error by comparing a feedback phase to a reference phase;
 determining a frequency error by comparing a feedback frequency to a reference frequency; and
 determining a lock signal in response to the phase error being less than an upper phase threshold and greater than a lower phase threshold, and the frequency error being less than an upper frequency threshold and greater than a lower frequency threshold.

10. The method of claim 9 wherein the phase error is one of being greater than the upper phase threshold and being less than the lower phase threshold when the frequency error is zero.

11. The method of claim 9 wherein the frequency error is one of being greater than the upper frequency threshold and being less than the lower frequency threshold when the phase error is zero.

12. The method of claim 9 further comprising differentiating the feedback phase to generate the feedback frequency.

13. The method of claim 9 wherein determining the lock signal comprises setting the lock signal to an unlocked state in response to one of the phase error being greater than a second upper phase threshold, the phase error being lower than a second lower phase threshold, the frequency error being greater than a second upper frequency threshold and the frequency error being lower than a second lower frequency threshold.

14. The method of claim 9 further comprising filtering the lock signal.

15. A method for Phase Lock Loop (PLL) lock detection comprising:
 setting a lock signal to a locked state in response to a phase error being less than a first upper phase threshold and greater than a first lower phase threshold, and a frequency error being less than a first upper frequency threshold and greater than a first lower frequency threshold, wherein the phase error equals a phase difference between a feedback phase and a reference phase, and the frequency error equals a frequency difference between a feedback frequency and a reference frequency; and
 setting the lock signal to an unlocked state in response to one of the phase error being greater than a second upper phase threshold, the phase error being less than a second lower phase threshold, the frequency error being greater than a second upper frequency threshold and the frequency error being less than a second lower frequency threshold.

16. The method of claim 15 wherein the phase error is one of being greater than the upper phase threshold and being less than the lower phase threshold when the frequency error is zero.

17. The method of claim 15 wherein the frequency error is one of being greater than the upper frequency threshold and being less than the lower frequency threshold when the phase error is zero.

18. The method of claim 15 wherein the first upper phase threshold is less than the second upper phase threshold, the first lower phase threshold is greater than the second lower phase threshold, the first upper frequency threshold is less than the second upper frequency threshold, and the first lower frequency threshold is greater than the second lower frequency threshold.

\* \* \* \* \*